United States Patent [19]

Saunders et al.

[11] 4,277,831
[45] Jul. 7, 1981

[54] COMPUTER AIDED WIRE WRAP OPERATOR CHECK SYSTEM

[75] Inventors: Robert C. Saunders; Dean T. Au; W. Ray Williams; Donald Zurek, all of Phoenix, Ariz.

[73] Assignee: Honeywell Information Systems Inc., Phoenix, Ariz.

[21] Appl. No.: 40,249

[22] Filed: May 18, 1979

[51] Int. Cl.³ ............................................. G01R 31/02
[52] U.S. Cl. .................................. 364/481; 364/579; 364/580; 324/73 AT; 29/755
[58] Field of Search ....................... 364/481, 579–580; 29/749–755; 324/51, 66, 73AT

[56] References Cited

U.S. PATENT DOCUMENTS

| | | | |
|---|---|---|---|
| 3,598,977 | 8/1971 | Clemmons | 364/488 |
| 3,702,004 | 10/1972 | Eskew et al. | 364/489 X |
| 3,784,910 | 1/1974 | Sylvan | 324/51 X |
| 3,832,535 | 8/1974 | Vito | 324/51 X |
| 3,842,496 | 10/1974 | Mercer | 29/755 X |
| 4,030,029 | 6/1977 | Cox | 29/755 X |
| 4,091,325 | 5/1978 | Marcus et al. | 324/66 X |
| 4,183,091 | 1/1980 | Maurai | 324/51 X |

*Primary Examiner*—Edward J. Wise
*Attorney, Agent, or Firm*—William W. Holloway, Jr.; Ronald T. Reiling; Nicholas Prasinos

[57] ABSTRACT

There is disclosed herein an apparatus for computerized real time verification of the correctness of pin locations for wire wrap connections made by human operators in constructing or upgrading computer backplanes. A suitably programmed microprocessor operates from a data base consisting of the information from a wire list drawing fed into the microprocessor's memory from a cassette tape record. The microprocessor is linked to the backplane to be verified and to the hand operated wire wrap gun serving as the test probe by a uniquely designed Wire Check System Interface. Both wire adds and wire deletes may be made. The microprocessor serves to check the operator's badge number for proper authority, bootload the data base, find the sequence of wires to be added or deleted, display the addition or deletion data on a CRT by identifying the "from" and "to" pins, and to verify the correct placement of the wire wrap gun by the operator by lighting a red or green LED and sounding an audible alarm on red when an index/test strip switch is activated by the operator. Printed reports of wire check errors are also generated.

In the preferred embodiment, use of the computer aided wire wrap operator check system can be expected to reduce wiring errors to an average of five errors per upgraded or newly constructed system—a figure which can result in substantial cost savings.

10 Claims, 8 Drawing Figures

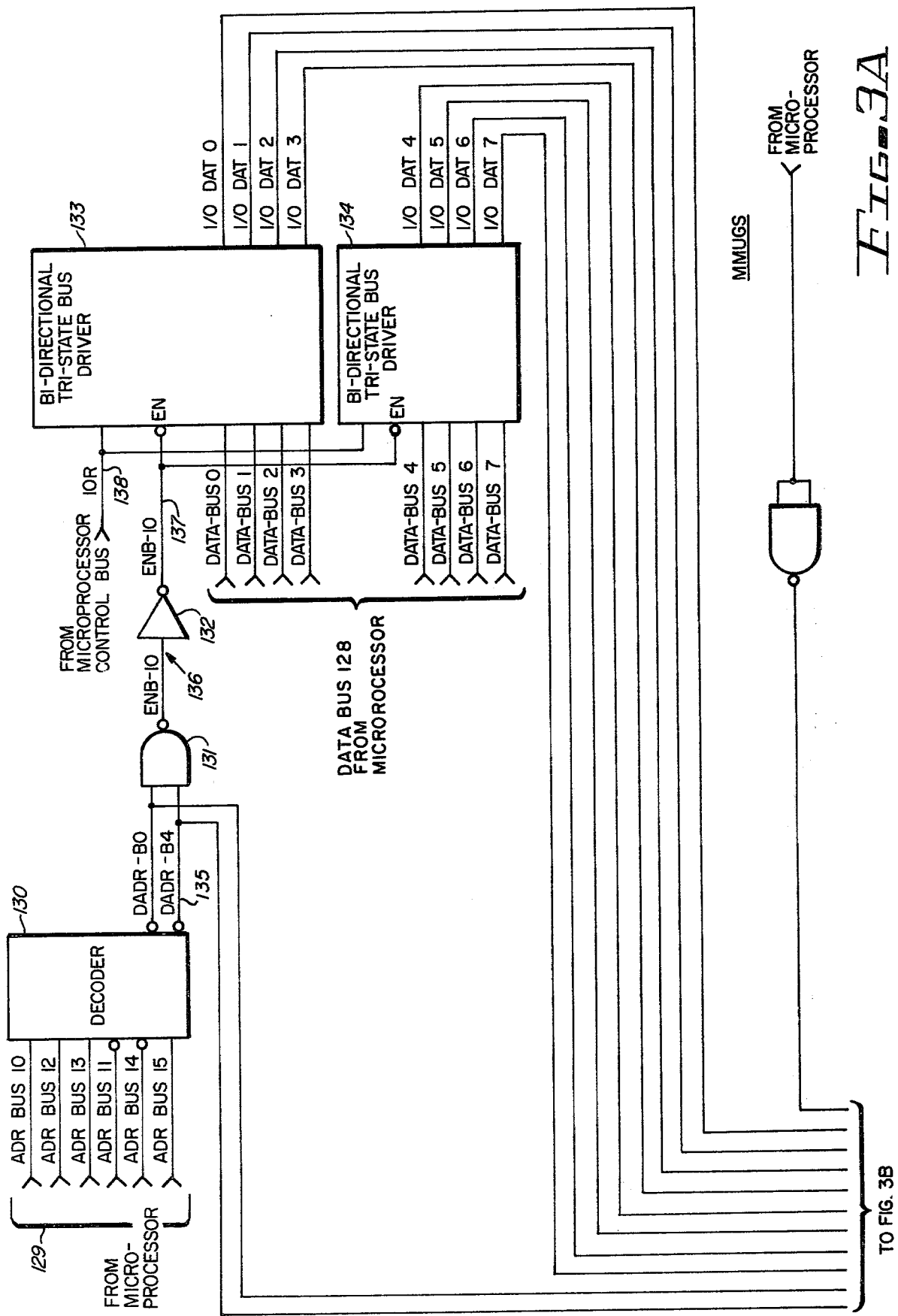

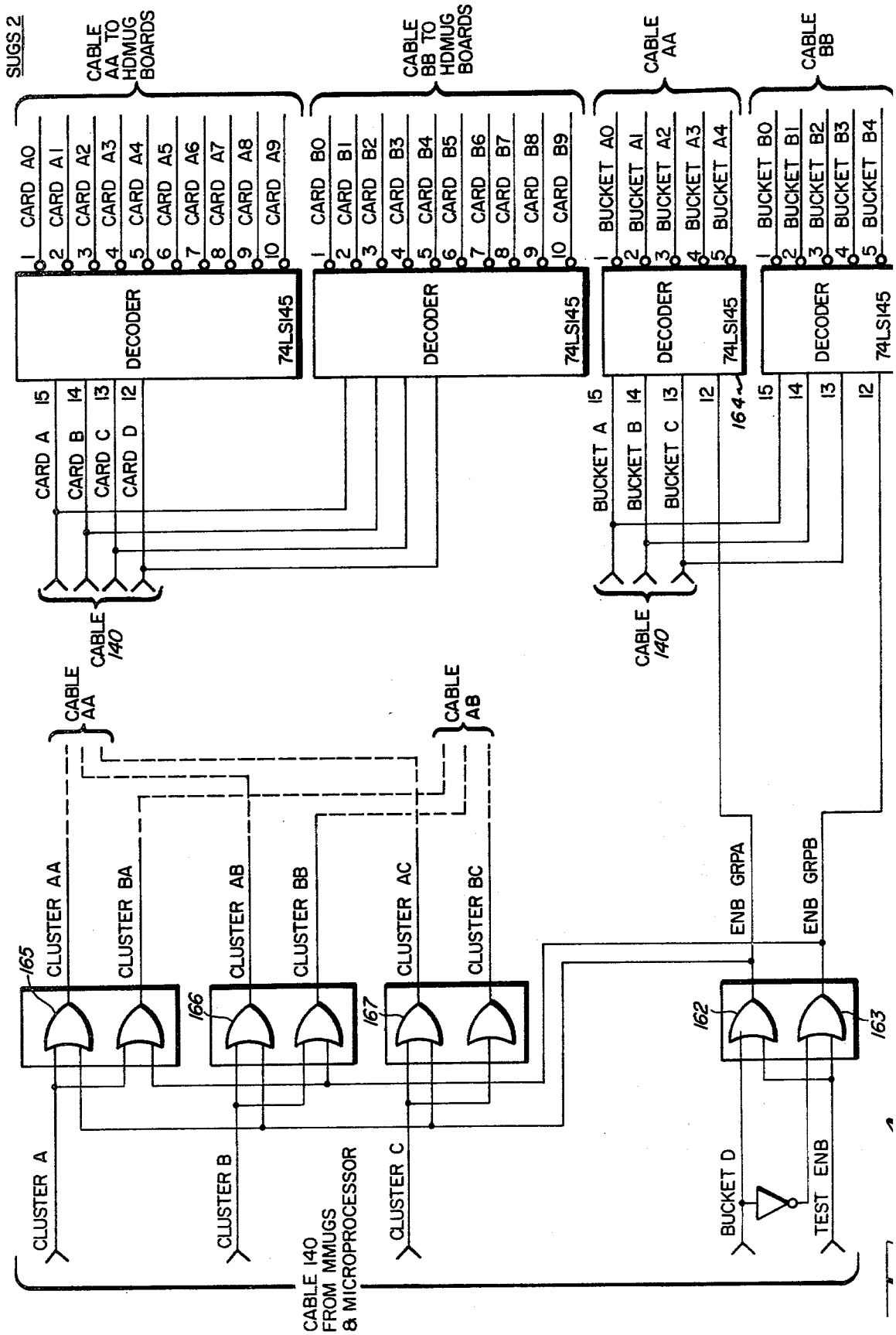

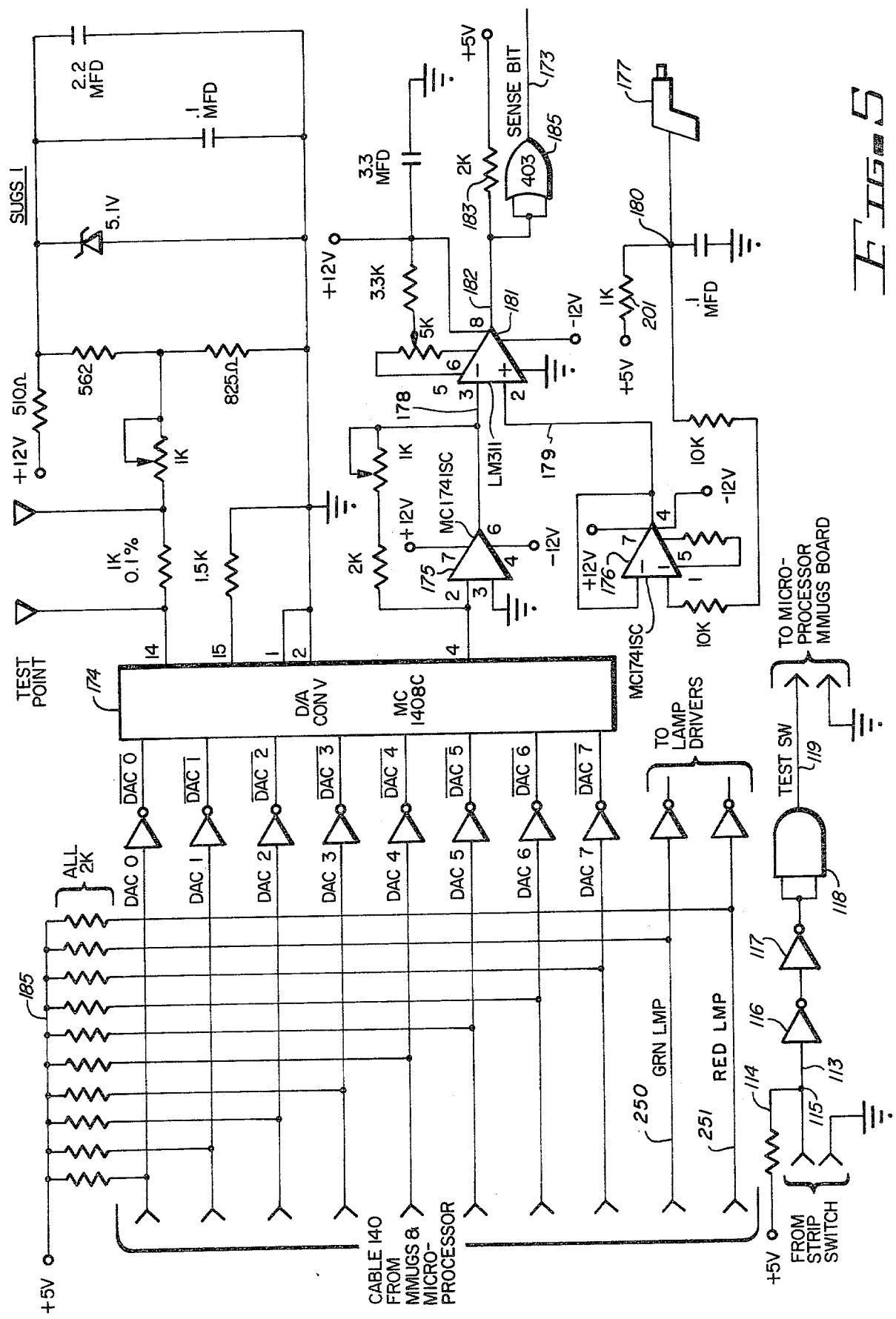

COMPUTER AIDED WIRE WRAP OPERATOR CHECK SYSTEM

BACKGROUND OF THE INVENTION

The invention relates generally to the field of electrical computers and data processing systems and more particularly to the field of computerized testing and evaluation of performance for quality control purposes.

It is believed by the applicant that the disclosed apparatus is the first of its kind to be developed. Other wire wrap aids have been developed but none perform the functions of the invention described herein with respect to verifying that the operator is on the right pin. For example, the WWM-380 wire wrapping machine manufactured by Standard Logic, Inc. will, by alphanumeric display, tell the operator what pins to wrap wires from and to but will not verify that the right pins have been wrapped. This is of some assistance to wire wrap operators in relieving them of the necessity of averting their eyes from a very complicated and dense array of pins to a prolix and densely packed wire list. The prior art system allows the operator to see only one line at a time from the wire list in a large brightly lit alphanumeric display, but no verification of placement of the wire wrap tool on the right pin is provided as in the disclosed invention. The pin verification and board test functions of the disclosed invention represent major advances in the state of the art.

SUMMARY OF THE INVENTION

Broadly speaking, the system comprises a first means for supplying binary pin data indicating which pin in an array of wire wrap pins is the correct pin for one operation in a particular wiring transaction and for supplying condition data indicating a predetermined expected electrical condition (such as ground of +5 volts potential or some voltage in between) on the pin touched by the operator. A second means then decodes the binary data indicating the correct pin and subjects the correct pin to a predetermined electrical condition. It then compares the expected electrical condition as derived from the condition data from the first means to the electrical condition on the pin actually touched and generates a signal indicative of whether the pin touched was correct.

In the preferred embodiment, the first means is a programmed digital computer which retrieves binary pin and condition data from a magnetic storage media or other memory and sends it to the second means. However, in other embodiments the pin and condition data could be supplied from any outside source of data such as a human operator pushing buttons, a mechanical sequential machine or a hard wired, clocked, sequential state logic device. Other embodiments might also subject only the correct pin to the predetermined electrical condition instead of a periodically spaced cluster of pins one of which is the correct pin. Still other embodiments might subject the cluster or correct pin to a predetermined electrical condition such as a voltage or current and then compare this to a fixed standard as opposed to comparison with the condition data supplied from the microprocessor in the preferred embodiment.

More specifically, the system consists of a microprocessor or other digital computer (CPU) linked in combination with a cassette tape handler, a printer, a terminal and a Wire Check System Interface which serves to link the wire wrap tool, strip switch and the board to be verified to the CPU. The gist of the invention lies in the Wire Check System Interface in combination with the CPU, the wire wrap tool having a wrapping element made of electrically conductive material, the strip switch, and the board under test. It is this interface which allows the microprocessor to verify that the wire wrap tool has been placed on the proper pin and that completed boards are properly wired. Three specially designed interface boards accomplish this task as follows.

The wire wrapped backplane which is to be updated or wired from scratch consists of a large board having a wire wrap pin side and a logic board side. The various logic boards comprising the computer have edge connectors which are inserted into sockets on the logic board side of the backplane. The logic board side is divided into ten "buckets", each bucket holding ten logic boards. The buckets are divided evenly between an "A" and a "B" side.

The other side or wire wrap pin side of the backplane contains hundreds of wire wrap pins which are connected to the sockets holding the logic boards. Wires connect the wire wrap pins of the various buckets thereby linking the various logic boards together to complete the circuitry of the computer.

The invention substitutes a number of HDMUG boards for the logic boards of a computer normally inserted in the card slots in the logic board side of the backplane. Each HDMUG board is the same and consists of a diode matrix. Individual card and bucket addresses are assigned to each HDMUG board by the use of jumpers. The purpose of these HDMUG boards is to connect a selected cluster of pins to ground through a resistor when so directed by the microprocessor during a wire transaction.

Another interface board in the microprocessor, MMUGS, serves to convert the binary information on the microprocessor data bus to binary card, bucket, and cluster information when addressed by the microprocessor.

A SUGS2 board decodes the card, bucket, and cluster information and generates single line signals to select the HDMUG board in the desired card and bucket location embracing one pin involved in the wire transaction to be verified and it grounds the appropriate cluster of pins.

Finally, a SUGS1 board serves to compare the voltage sensed on a particular pin by the tip of the wire wrap tool with an analog signal supplied by the microprocessor through a digital to analog converter. If the voltage on the pin is as it should be, the microprocessor lights a green LED on the wire wrap gun. If not, then a red LED is lit.

The software in the microprocessor also causes it to display data needed for each wire transaction and print various reports.

The advantages of elimination or substantial reduction in wire wrap errors and substantial cost reduction in manufacturing, updating, and debugging of wire wrapped backplanes inherent in use of the present invention should be readily apparent. A more detailed understanding of how these advantages are achieved may be had by consideration of the following drawings and detailed description of the preferred embodiment.

BRIEF DESCRIPTION OF THE DRAWINGS

FIGS. 3A and 3B are logic diagrams of the MMUGS interface board.

FIG. 4 is a logic diagram of the SUGS2 interface board.

FIG. 5 is a logic diagram of the SUGS1 interface board.

DETAILED DESCRIPTION OF THE PREFERRED EMBODIMENT

Figure 1A:
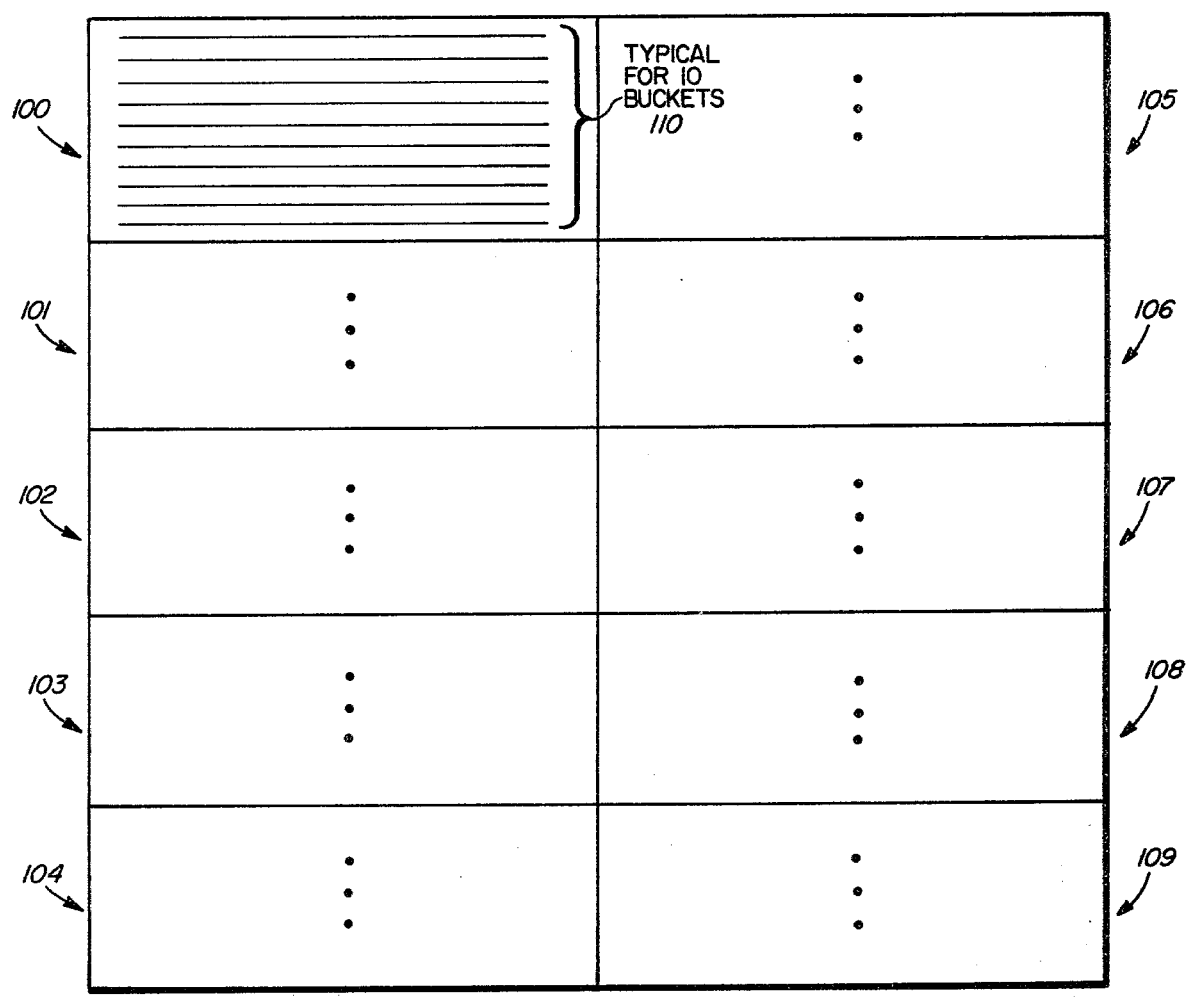
FIG. 1A is a drawing of the logic board side of the backplane.
Figure 1B:
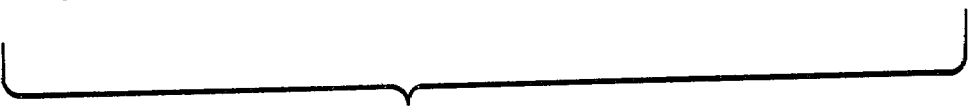
FIG. 1B is a drawing of the wire wrap pin side of the backplane

FIGS. 1A and 1B illustrate the wire wrap pin side (1B) and the logic card side (1A) of the backplane to be verified. FIG. 1A shows the logic card side to be divided into ten "buckets" 9 100 through 109. Each bucket has ten card slots 110 as typically illustrated for bucket 100. Each card slot has numerous electrical contacts each of which is connected to a wire wrap pin on the reverse side of the backplane. These wire wrap pins are arranged typically in a matrix as shown in FIG. 1B. Each electrical contact in the card slots makes contact with another electrical contact on the backplane edge of a logic card of the end product computer unit. However, in the present invention in order to verify the proper wire wrapping of the subject backplane, 100 HDMUG boards, illustrated in FIG. 6, are inserted into the 100 card slots of the ten buckets.

Figure 2:
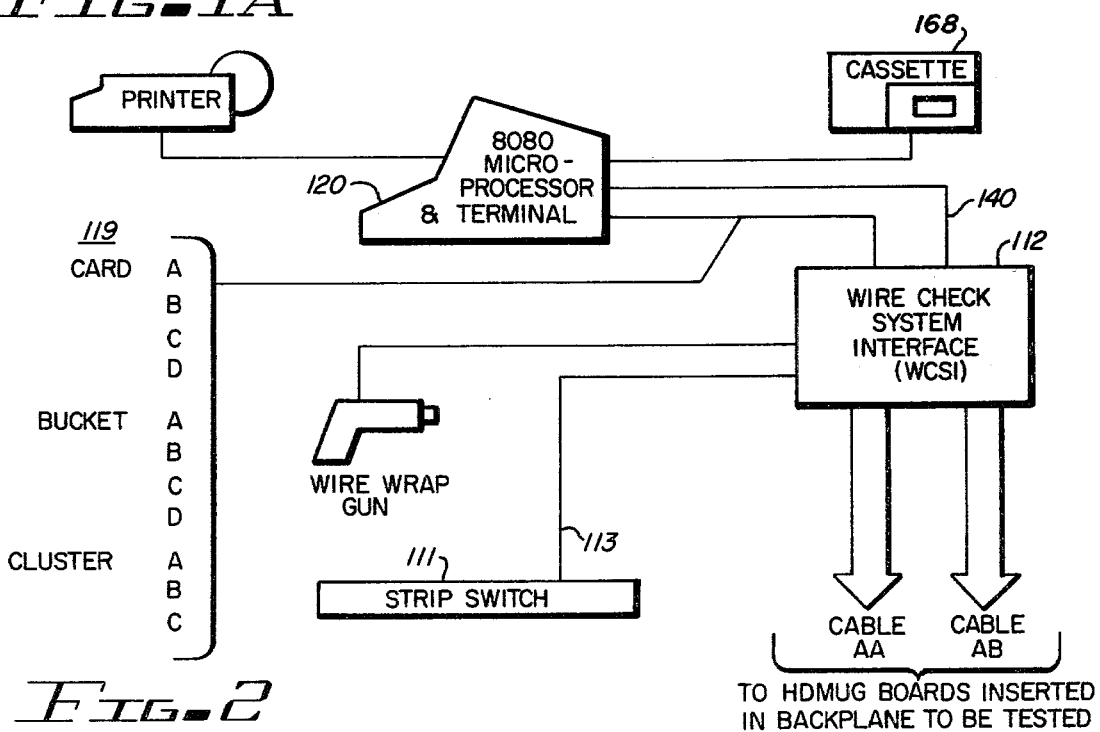
FIG. 2 is a block diagram of the overall system.
Figure 6:
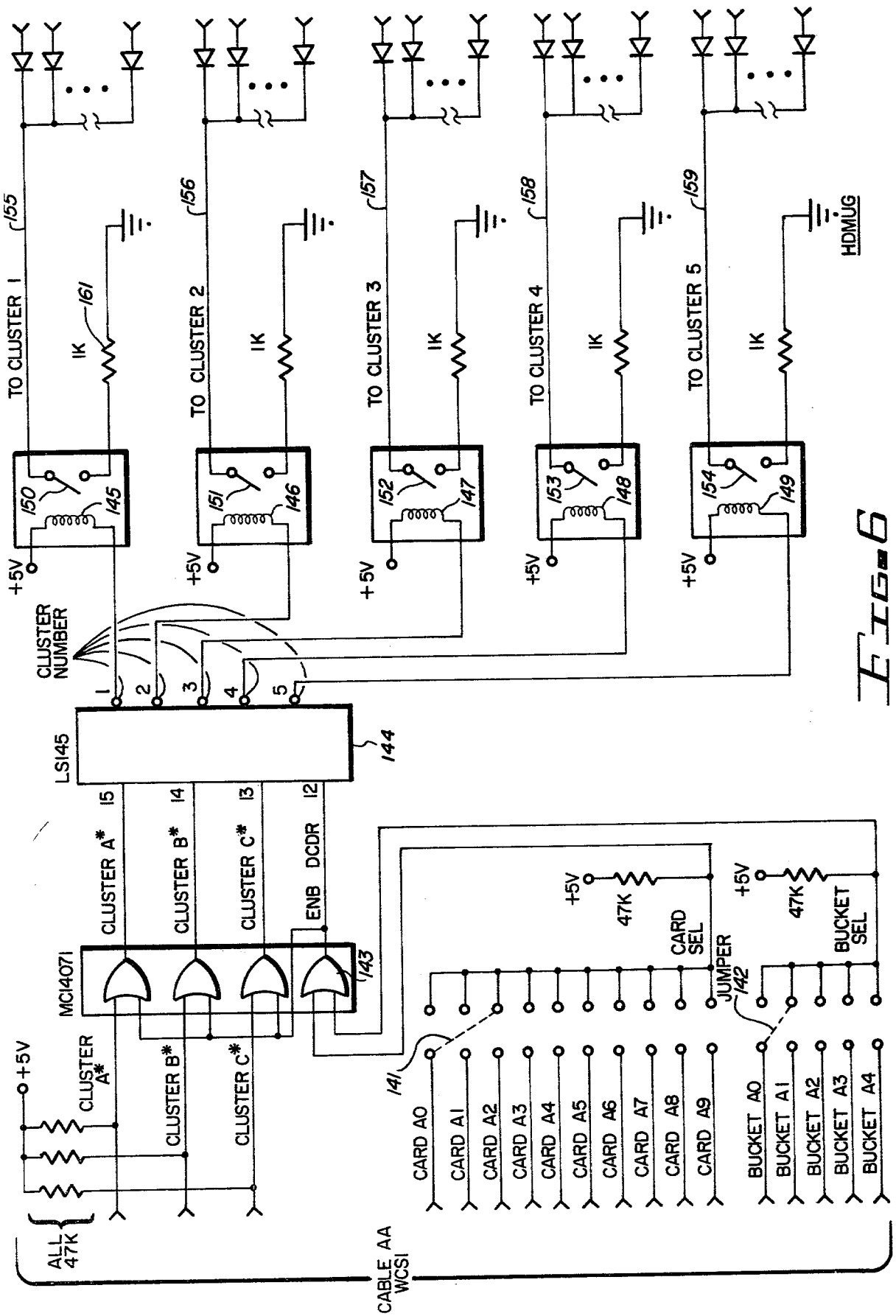
FIG. 6 is a logic diagram of the HDMUG interface board.

Each of these HDMUG boards has an individual card and bucket address, however they are all wired the same and jumpers are used, as shown in FIG. 6, to give each HDMUG board a unique card and bucket address. The purpose of these HDMUG boards is to decode binary pin data i.e. cluster selection signals or cluster data sent over cables AA and AB from the Wire Check System Interface (WCSI). WCSI merely passes this binary cluster information through from the CPU from which it was originally part of the binary pin data comprised of card, bucket and cluster data. The cluster data is passed to the HDMUG board having the proper card and bucket address specified in the original binary pin data. The HDMUG board then uses the decoded binary cluster data to subject a particular cluster of pins, one of which is the proper pin for one operation in a wire transaction to a predetermined electrical condition. In the preferred embodiment, this electrical condition is grounding through a 1K resistor. The card and bucket information on cables AA and AB pick the bucket and card contacting one of the pins involved in the particular wire transaction one pin at a time first for the "from" pin then for the "to" pin. The software in the preferred embodiment is set up so that when the operator is ready to verify he or she merely depresses strip switch 111 (in FIG. 2). The condition of the strip switch is relayed to the WCSI, 112 in FIG. 2, along line 113 in FIGS. 2 and 5.

Line 113 goes to the SUGS1 board of the WCSI illustrated in FIG. 5. It is seen there that the strip switch 111 serves to float or ground point 115 causing line 113 to be in either the logical one or zero state because of the presence of pull-up resistor 114. Inverters 116 and 117 and line driver 118 prepare this logical one or zero for transmission along line 119 to the MMUGS board plugged into the backplane of microprocessor 120 in FIG. 2. Depression of the strip switch lowers line 119 and release thereof raises the line.

Figure 3B:
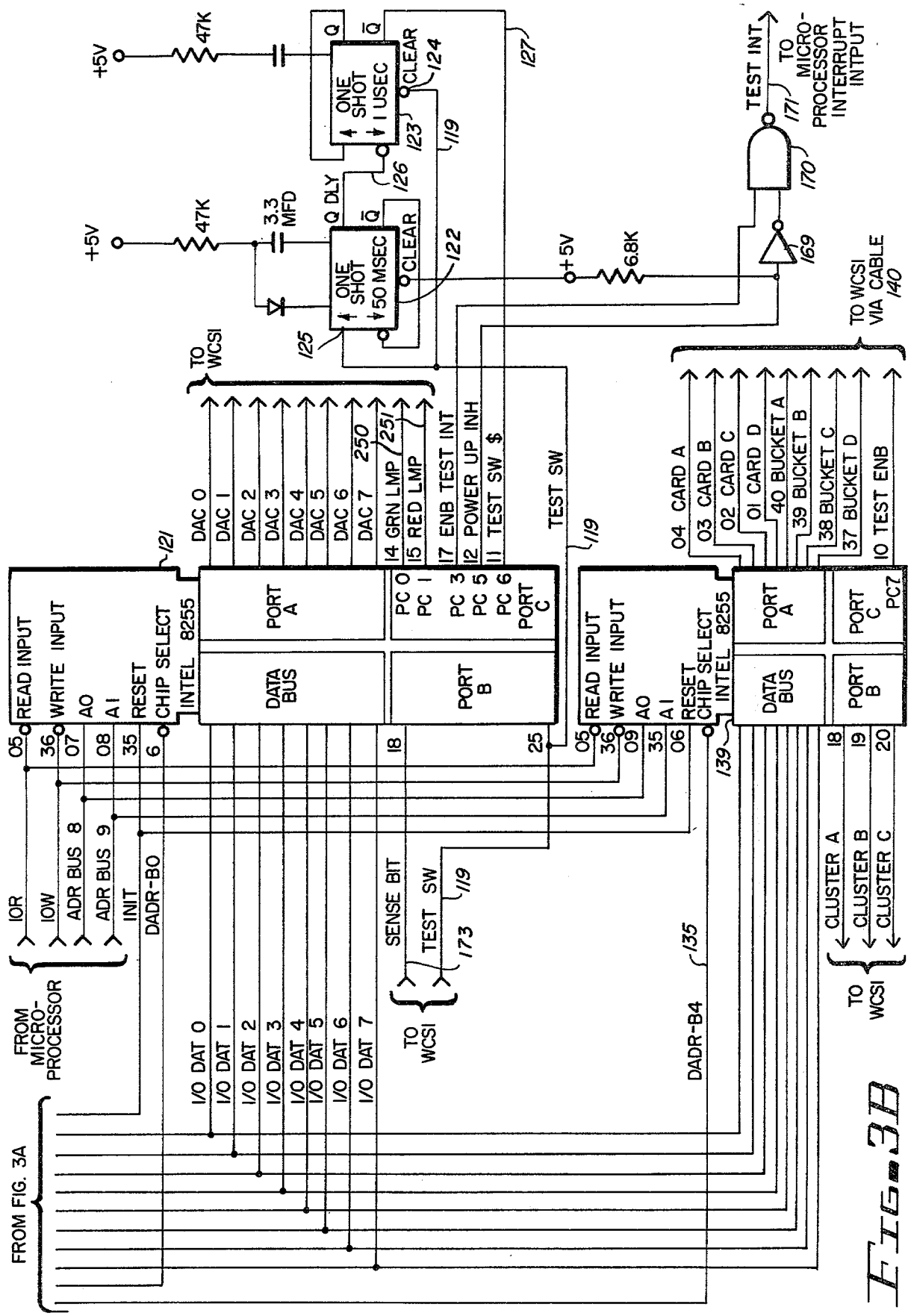

Line 119 enters Port B of PPI 121 of the MMUGS board illustrated in FIG. 3B. It also is connected to two "one shots". When the strip switch 111 is depressed, the lowering of line 119 clears the one microsecond one shot 123 at the clear input 124. When the strip switch is released, the rising edge on line 119 triggers the fifty millisecond one shot, 122, at the positive going input 125. One shot 122 then sends a positive going pulse of fifty millisecond duration out from the Q output. This Test Sw. Dly. signal on line 126 is connected to the negative transition input of one shot 123 and, when line 126 returns low, causes one shot 123 to send a negative going pulse of one microsecond duration out from the Q output as the Test Sw. S signal on line 127. This low going pulse sets an interrupt bit in Port C of PPI 121 signaling the microprocessor 120 that the strip switch has been depressed and a pin needs to be verified.

The software is set up to service these interrupts by accessing the data for a particular wire transaction and emitting a data word on data bus 128 in FIG. 3A. This data word will be written to an address such that address bus lines 10 through 15, 129 in FIG. 3A, are decoded by decoder 130 to cause the DADR-B4 line to go low. Prior to this write operation, decoder 130 had held both the DADR-B4 and DADR-B$\phi$ lines high. When DADR-B4 goes low on line 135, the ENB-I$\phi$ signal on line 136 goes high since the DADR-B$\phi$ input to gate 131 is still high. Prior to this write, line 136 had been low, keeping line 137 high and bus drivers 133 and 134 in the high-Z state. The lowering of line 137 enables these bus drivers and, in conjunction with the IOR signal on line 138 from the microprocessor control bus, causes transfer of the data word to I/O DAT lines 0–7 in FIGS. 3A and 3B. These lines enter the data bus port of PPI's 121 and 139.

This data must be directed somewhere. DADR-B4 on line 135 and address bus lines 8 and 9 serve this purpose. With DADR-B4 low and address bus lines 8 and 9 both low, PPI 139 is selected and the data is directed to the A port to become the card and bucket binary addresses.

Referring now to the logic diagram of the SUGS2 board shown in FIG. 4, it is seen that the card and bucket information enters SUGS2 via cable 140. The information is decoded in several decoders (which can be 74LS145's) and is sent out over cable AA or AB to select the proper HDMUG board connected to the pin in question.

As noted earlier, each HDMUG board has a unique card and bucket address. Referring to FIG. 6, it is seen that the unique address is provided for each HDMUG board by changing the connections of jumpers 141 and 142. FIG. 6 as drawn shows jumper connections for card zero in bucket zero on the "A" side of the backplane. A similar address exists for card zero and bucket zero on the "B" side of the backplane except the card B$\phi$ and bucket B$\phi$ lines from cable BB would be jumpered to the Card Sel and Bucket Sel lines. In FIG. 6 it is seen that when the card A$\phi$ and bucket A$\phi$ lines go low, the Card Sel and Bucket Sel lines go low causing OR gate 143 to drive the ENB DCDR line low. When this happens, decoder 144 is enabled such that binary cluster information reaching it on the cluster A*, B* and C* lines may be decoded into a low signal on any of the cluster 1,2,3,4 or 5 lines. A low on any one of these lines causes the relay coil (145 or 146 or 147 or 148 or 149) connected to the line (155-159) to energize, closing the corresponding relay contact (150-154) responsive to the energized coil. When one of these relay contacts closes, the corresponding diode cluster connected to one of the five output lines 155-159 is connected to ground through the relay contact and a one thousand ohm resistor such as 161.

Referring again to FIG. 4, the TEST ENB and BUCKET D lines combine in OR gates 162 and 163 to create the ENB GRPA and ENB GRP B signals. ENB GRPA goes low when both BUCKET D and TEST ENB go low, which occurs under software control when the proper data words are written into ports A and C of PPI 139 in preparation for testing a pin. When ENB GRPA goes low, the A side bucket decoder 164 is enabled as are the A side cluster gates 165-7. The software then can write the proper data word into port B of PPI 139 in FIG. 3B to select the cluster embracing the pin to be verified. The pin data i.e. bucket, card and cluster data, is derived from a data base record taken from cassette player 168 in FIG. 2, which is compiled from a wire list drawing which lists the wire adds and deletes for a particular job.

The cluster concept is used in the preferred embodiment since the system is designed only to verify that the operator has placed the wire wrap gun on the correct pin and not to find the pin in the first place. This concept assumes that the operator can get close to the correct pin using human senses and relies on the operator's ability to get within a few pins horizontally and a few pins vertically of the correct pin. Other embodiments might use circuitry to subject only the correct pin to the predetermined electrical condition.

To illustrate let us refer to FIG. 1B, where a selection of a cluster of pins is illustrated by "X's" on the pins. For example, every fifth pin may be selected. If it is assumed that the WD section of pins is the first section, cluster zero can start at pin zero thereof and consist of every fifth pin, e.g., pins 00, 05, 10, etc. Likewise, cluster one can start at pin 01 and include every fifth pin, e.g., 01, 06, 11, etc. Therefore, it is seen that for the operator to get a "correct pin" green LED when she was actually on the wrong pin would require a compound mistake of being either one pin over and several pins up or down from the correct pin or in the right row but five pins off.

When the operator is ready to test her placement of the wire wrap gun, she presses strip switch 111. As noted earlier in conjunction with the discussion of FIGS. 5 and 3B, depression of the strip switch causes a negative going pulse from one shot 123 to propagate down the Test Sw. $ line in FIG. 3B to PC6 of port C of PPI 121. PPI 121 was initialized by the software at power up to make port A an output and port B an input port. A control word was also written in the bit set/reset format for the Intel 8255 to set INTE A inside the port by setting PC6. PC5 on pin 12 was initially set at logical one to cause inverter 169 to present a logical zero at one input to NAND gate 170 thereby preventing interrupts during the power up period while the ports are in the high state prior to initialization. PC5 is set at zero and stays there as soon as PPI 121 is initialized thereby enabling interrupts. The ENB TEST INT signal from PC3 is under control of PPI 121 and goes high when Test Sw. $ goes low thereby causing NAND gate 170 to interrupt the microprocessor via the TEST INT on line 171.

When the microprocessor (CPU) is interrupted, it enters a subroutine to service the test request. This subroutine can be programmed in many different ways but its function is to supply the condition data in the form of the DAC 0-7 signals to the WSCI to inform it of the electrical condition expected to be seen by the WSCI on the pin touched by the operator. WCSI then compares the expected electrical condition to that actually found on the pin touched by the operator in SUGS1 and generates an output signal, Sense Bit 173, from SUGS1 indicative of whether the condition found was as expected. The subroutine then reads the output from SUGS1, Sense Bit, PPI 121, FIG. 3B. In the preferred embodiment the expected electrical condition takes the form of a voltage. The subroutine lights a green LED on line 250 if the voltage on the pin corresponds to the correct voltage as determined by digital to analog conversion of the condition data word from the data base on the DAC 0-7 lines. If the voltage on the pin is not correct, the red LED will be lit. Whether the voltage was correct or not is determined by the microprocessor which reads the Sense Bit signal coming into port B on line 173. One digital state indicates a correct reading and the other an incorrect reading. The Test SW input to pin 25 of port B on line 119 enables the software to read the state of the switch at any desired time in the program.

SUGS1, illustrated in FIG. 5, functions to make the voltage comparison noted above. Digital to analog converter 174 receives the data word through lines DAC 0-7 and converts it to a current signal the magnitude of which indicates the level of voltage which should be seen at the pin by the metal probe of the wire wrap tool. Operation amplifier 175 serves to convert the current signal from the D/A converter 174 into an output voltage on line 178. Operational amplifier 176 serves as a unity gain isolation amplifer to transmit the voltage at junction 180, representing the pin signal to line 179. The voltage at junction 180 will be approximately 2.5 volts if the wire wrap gun 177 is on one of the pins of the cluster selected by the HDMUG board. Recall from the discussion of FIG. 6 that when a cluster is selected, all the pins therein are connected to ground through a one thousand ohm resistor thereby forming a voltage divider with resistor 201 and dividing the +5 Volts in half.

Comparator 181 serves to compare the voltages on lines 178 and 179 and has an open collector output connected by line 182 to pull-up resistor 183 and a positive five volt supply. Comparator 181 grounds line 182 when one of its inputs exceeds the other. The Sense Bit signal on line 173 is derived from the signal on line 182 through line driver 185. As noted earlier, the Sense Bit signal goes to port B of the MMUGS board for analysis by the microprocessor. In other embodiments an output signal from SUGS1 might be used to light the red or green LEDS.

The circuitry connected to pins 1, 2, 14 and 15 of the digital to analog converter 174, which can be a Motorola MC1408C, is used to provide a precise current reference source to the digital to analog converter 174. Resistors 185 on the DAC side of D/A converter 174 serve as pull-up resistors for open collector line drivers at the MMUGS board (not shown in FIG. 3A or 3B).

Two comparisons are made for each pin test. In the first, a high value of voltage is written onto line 178 by D/A converter 174 and the voltage on line 179 is checked to see if it is less. Another comparison is made when the D/A converter writes a low voltage onto line 178 to ensure that the voltage on line 179 is greater. In this way a bracketing of the pin voltage is obtained and a wiring error can be prevented if a voltage outside the brackets is sensed.

Although the invention has been described in terms of a preferred embodiment, those skilled in the art may devise other equivalent means of performing the same function using any of a number of new products appearing on the market periodically. It is intended that these equivalent embodiments be included.

What is claimed is:

1. A wire wrap error check apparatus for verification of correct placement of a wire wrap tool on a wire wrap pin in an array of pins on a logic board comprising:
   (a) a first means for supplying binary pin data indicating which pin in an array of pins is the correct pin for one operation in a particular wiring transaction and for supplying condition data indicating an expected electrical condition on the pin touched;
   (b) a second means for decoding said binary pin data indicating the correct pin and for subjecting said correct pin to said predetermined electrical condition and for comparing the expected electrical condition derived from said condition data to the actual electrical condition on the pin touched and for generating a signal indicative of whether the pin touched was correct.

2. A wire wrap error check apparatus for verifying correct placement of a wire wrap tool on a pin in an array of pins on a logic board comprising:
   (a) a digital computer means under program control for generating binary pin and condition data, said pin data indicating which cluster of pins at periodic spacing in said array of pins embraces the correct pin for an operation in a particular wire transaction, and said condition information indicating the electrical condition expected to be found on said correct pin, said digital computer means also for analyzing the results of a comparison between said expected electrical condition for said correct pin versus the electrical condition on the pin actually touched and for signalling the correctness or incorrectness of the wire wrap tool placement;
   (b) a first means for performing wire wrap operations on wire wrap pins in wiring transactions and for sensing the electrical condition on said wire wrap pins;
   (c) a second means for initiating said comparison;
   (d) a third means for making electrical contact with said wire wrap pins on said logic board and for subjecting selectable clusters of said wire wrap pins to a predetermined electrical condition;
   (e) a fourth means connected to said digital computer means, said first means, said second means and said third means for decoding said pin data and for causing said third means to subject the cluster of pins designated by said pin data to said predetermined electrical condition, and for sensing when said second means signals initiation of a comparison, and for decoding said condition data to derive the expected electrical condition for placement of said first means on said correct pin, and for comparing the electrical condition on the pin touched as sensed by said first means to the expected electrical condition for said correct pin, and for signalling said digital computer means of the results of said comparison.

3. An apparatus for verifying correct placement of a wire wrap tool on a pin in an array of pins comprising:
   (a) a digital computer means programmed to generate binary DAC, card, bucket and cluster data from a data base containing data on a plurality of wire addition or deletion transactions, said card, bucket and cluster data used for subjecting a selected cluster of pins in said array of pins one of which is the correct pin for an operation in said transaction to a predetermined electrical condition, said DAC data for comparing the electrical condition actually found on the pin on which said wire wrap tool is placed with the expected electrical condition as indicated by said DAC data and as placed on said selected cluster of pins, and for generating a "good test" or "bad test" signal;
   (b) a wire wrap tool means with an electrically conductive wrapping element for wrapping wires around any pin in an array of pins and for making electrical contact with said pin;
   (c) a strip switch means for signalling when verification of placement of said wire wrap tool is desired;
   (d) a backplane means the wiring of which is to be verified consisting of a wire wrap pin side and a logic board side, said logic board side divided into a plurality of "buckets" each bucket having a card slot containing a plurality of electrical contacts for making contact with the edge connectors of a logic board inserted in said card slot and said wire wrap pin side having a plurality of wire wrap pins electrically connected to said electrical terminals in said card slot;
   (e) a plurality of HDMUG board means consisting of a diode matrix connected to a plurality of clusters of said wire wrap pins with each HDMUG board means having a unique card and bucket address to receive binary cluster information and decode it into a single line cluster signal used for causing a predetermined voltage on the selected cluster;
   (f) a wire check system interface means linked to said wire wrap tool means, said strip switchs means, and said HDMUG board means for receiving said binary DAC, card, bucket and cluster data from said digital computer means for comparing the expected voltage as represented by said DAC data for the correct pin to the voltage on the pin actually touching the wire wrap tool when said strip switch is depressed, and for sending a digital sense bit to said digital computer indicating the results of said comparison;
   (g) an indicating means responsive to said digital computer for receiving said "good test" and "bad test" signal for indicating the results of said comparison;

4. An apparatus for verifying correct placement of a wire wrap tool on a pin in an array of pins comprising:
   (a) a digital computer means programmed to generate binary DAC, card, bucket and cluster information from a data base containing data on one or more wire addition or deletion transactions and for generating a "good test" or "bad test" signal;
   (b) a wire wrap tool means for wrapping wires around any pin in an array of pins and for making electrical contact with said pin;
   (c) a strip switch means for signalling when a verification of placement of said wire wrap tool is desired;

(d) a backplane means consisting of a wire wrap pin side and a logic board side, said logic board side divided into a plurality of "buckets" each having a distinct bucket address and each bucket having a plurality of card slots having electrical terminals therein and said wire wrap pin side having a plurality of wire wrap pins electrically connected to said terminals in said card slots;

(e) a plurality of HDMUG logic board means inserted in said card slots and each having a distinct card address means said HDMUG logic board means for subjecting a selected cluster of pins of a predetermined electrical condition when said cluster is selected by said digital computer means;

(f) a wire check system interface means linked to said wire wrap tool means, said strip switch means, and said HDMUG board means for receiving said binary card, bucket and cluster data from said digital computer means indicating the proper card, bucket and cluster addresses for the cluster embracing the correct pin for an operation in said wire addition or deletion transaction and for decoding it into single line signals to select the HDMUG board means at the card and bucket address embracing one pin involved in the wire transaction to be verified and for passing said cluster data through to said selected HDMUG board to be decoded there for the purpose of subjecting the selected cluster of pins to bear a predetermined voltage, and said wire check system interface means for sensing when said strip switch means signals a verification test is to be performed, and to receive said binary DAC information from said digital computer means indicating the expected voltage for the correct pin and for converting it to a voltage and then to compare this voltage with the voltage on the wire wrap pin actually touching the wire wrap tool and to generate a sense bit to be read by said digital computer means to indicate the results of the comparison;

(g) an indicating means linked to said digital computer means for receiving said "good test" or "bad test" signal and for indicating the results of the test.

5. An apparatus as defined in claims 2 or 3 or 4 wherein said wire check system interface means includes:

(a) a decoder to decode said card and bucket data into a plurality of card and bucket signals with one card signal and one bucket signal active for each unique card and bucket address, said card and bucket signals serving to select the HDMUG board having the particular card and bucket address encoded in said binary card and bucket information from said digital computer means;

(b) a gating means for gating said binary cluster data from said digital computer means to the proper HDMUG logic board means connected to said cluster of pins embracing said correct pin for said operation in said wiring transacting;

(c) a digital to analog converter means responsive to said DAC data from said digital computer means for creating an output voltage which varies in magnitude in accordance with the magnitude represented by the binary encoded DAC data;

(d) a comparator means for comparing the magnitude of the output voltage from said digital to analog converter to the magnitude of the voltage on the pin actually touching said wire wrap tool means for purposes of comparing the expected value of the pin voltage, as represented by the DAC information, to the actual pin voltage, said comparator means also for generating a digital output SENSE BIT signal representing the results of the comparison.

6. An apparatus as defined in claim 5 wherein said HDMUG boards each comprise:

(a) a decoder means for decoding said binary cluster information from said wire check system interface means and deriving therefrom a signal to activate the selected one of a plurality of said clusters of pins;

(b) an address selection gating means for gating said binary cluster information through to said decoder means when said wire check system interface means decodes the particular card and bucket address of the particular HDMUG board having that card and bucket address from said pin data from said digital computer means;

(c) a switching means for causing said predetermined electrical condition to exist on said selected cluster of pins when said decoder means decodes the activation signal for the selected cluster from said binary cluster information.

7. An apparatus as defined in claims 2 or 3 or 4 wherein said HDMUG boards each comprise:

(a) a decoder means for decoding said binary cluster information from said wire check system interface means and deriving therefrom a signal to activate the selected one of a plurality of said clusters of pins;

(b) an address selection gating means for gating said binary cluster information through to said decoder means when said wire check system interface means decodes the particular card and bucket address of the particular HDMUG board having that card and bucket address from said pin data from said digital computer means;

(c) a switching means for causing said predetermined electrical condition to exist on said selected cluster of pins when said decoder means decodes the activation signal for the selected cluster from said binary cluster information.

8. An apparatus as defined in claim 2 or 3 or 4 wherein said digital computer includes an MMUGS logic board for interfacing between the address, data, and control buses of said digital computer and said wire check system interface means comprising:

(a) a decoder means connected to said address bus to decode a plurality of predetermined addresses from said address bus and generate an ENB-I$\phi$ signal when any of said addresses appears and to generate individual DADR signals for each said address indicating when said address appears on said address bus;

(b) a bidirectional tri-state bus driver means responsive to said ENB-I$\phi$ signal, and connected to said data bus and said control bus, and having a plurality of I0 DAT outputs, for presenting a high impedance to said data bus unit said ENB-I$\phi$ causes transition to the low impedance state at which time data can transfer between said data bus and said I0 DAT lines in the direction determined by an IOR signal from said control bus;

(c) a plurality of programmable peripheral interface means having a plurality of ports each having a distinct address said programmable peripheral interface means connected to said control bus, said I0

DAT lines, said DADR signals and to said wire check system interface means for directing data to and from said I0 DAT lines and said ports identified by the address on said address bus and in the direction specified by said control bus in such a manner that when the data on said I0 DAT lines represents said DAC information, it is directed through one port to said wire check system interface (WCSI), and when the data is card and bucket information, it is directed through another port to said WCSI, and when said data represents cluster information, it is directed through another port to said WSCI, said programmable peripheral interface means also for generating and sending a TEST INT signal through another port to interrupt said digital computer means when said strip switch is depressed to cause said digital computer means to read the signal from the wire check system interface means indicating the results of said comparison of expected to actual electrical conditions and for directing said "good test" or bad test" signal through a port to said indicating means after the interrupt is processed and the comparison made and said programmable peripheral interface means for receiving through another port data representing the status of said strip switch as the TEST SW signal and data representing the results of said comparison as the SENSE BIT signal from said wire check system interface means;

(d) a pulse generation means responsive to the position of said strip switch for sending a TEST SW$ signal to said programmable peripheral interface when said strip switch is operated causing said programmable peripheral interface to send said TEST INT signal to said digital computer means.

9. An apparatus as defined in claim 8 wherein said wire check system interace means includes:

(a) a decoder to decode said card and bucket data into a plurality of card and bucket signals with one card signal and one bucket signal active for each unique card and bucket address, said card and bucket signals serving to select the HDMUG board having the particular card and bucket address encoded in said binary card and bucket information from said digital computer means;

(b) a gating means for gating said binary cluster data from said digital computer means to the proper HDMUG logic board means connected to said cluster of pins embracing said correct pin for said operation in said wiring transaction;

(c) a digital to analog converter means responsive to said DAC data from said digital computer means for creating an output voltage which varies in magnitude in accordance with the magnitude represented by the binary encoded DAC data;

(d) a comparator means for comparing the magnitude of the output voltage from said digital to analog converter to the magnitude of the voltage on the pin actually touching said wire wrap tool means for purposes of comparing the expected value of the pin voltage, as represented by the DAC information, to the actual pin voltage, said comparator means also for generating a digital output SENSE BIT signal representing the results of the comparison.

10. An apparatus as defined in claim 8 wherein said HDMUG boards each comprise:

(a) a decoder means for decoding said binary cluster information from said wire check system interface means and deriving therefrom a signal to activate the selected one of a plurality of said cluster of pins;

(b) an address selection gating means for gating said binary cluster information through to said decoder means when said wire check system interface means decodes the particular card and bucket address of the particular HDMUG board having that card and bucket address from said pin data from said digital computer means;

(c) a switching means for causing said predetermined electrical condition to exist on said selected cluster of pins when said decoder means decodes the activation signal for the selected cluster from said binary cluster information.

* * * * *